United States Patent
Okada et al.

(10) Patent No.: US 6,610,608 B1
(45) Date of Patent: Aug. 26, 2003

(54) PLASMA ETCHING USING COMBINATION OF CHF$_3$ AND CH$_3$F

(75) Inventors: Lynne A. Okada, Sunnyvale, CA (US); Fei Wang, San Jose, CA (US); Calvin T. Gabriel, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/809,300

(22) Filed: Mar. 16, 2001

(51) Int. Cl.$^7$ .................... H01L 21/302; H01L 21/461
(52) U.S. Cl. .................. 438/724; 438/687; 438/738
(58) Field of Search .................. 438/687, 724, 438/735, 737, 700, 738

(56) References Cited

U.S. PATENT DOCUMENTS

| | | | | |
|---|---|---|---|---|
| 4,654,114 A | * | 3/1987 | Kadomura | 156/643 |
| 5,880,005 A | * | 3/1999 | Tsai et al. | 438/424 |
| 5,968,846 A | * | 10/1999 | Chou et al. | 438/712 |
| 5,972,789 A | * | 10/1999 | Jeng et al. | 438/637 |
| 6,123,862 A | * | 9/2000 | Donohoe et al. | 216/17 |
| 6,271,108 B1 | * | 8/2001 | Choe | 438/597 |
| 6,376,386 B1 | * | 4/2002 | Oshima | 438/714 |

OTHER PUBLICATIONS

Takashi Kawabe, et al. "Selevctive ion beam etching of Al2O3 films" J. Electrochem Soc. vol. 138, No. 9(Sep. 1991) pp. 2744–2748.*

* cited by examiner

*Primary Examiner*—Caridad Everhart (57) ABSTRACT

A method of manufacturing a semiconductor device includes forming a first level, forming a first barrier layer over the first level, forming a dielectric layer over the first barrier layer, forming an opening through the dielectric layer, etching the first barrier layer, and filling the opening with metal to form a first metal feature. The first barrier level is etched using CHF$_3$ and CH$_3$F. Additionally, the first barrier layer can be formed from silicon nitride.

13 Claims, 8 Drawing Sheets

FIG. 2H

PLASMA ETCHING USING COMBINATION OF CHF₃ AND CH₃F

FIELD OF THE INVENTION

The present invention relates to the manufacturing of semiconductor devices, and more particularly, to copper and copper alloy metallization in semiconductor devices.

BACKGROUND OF THE INVENTION

The escalating requirements for high density and performance associated with ultra large scale integration (ULSI) semiconductor device wiring are difficult to satisfy in terms of providing sub-micron-sized, low resistance-capacitance (RC) metalization patterns. This is particularly applicable when the sub-micron-features, such as vias, contact areas, lines, trenches, and other shaped openings or recesses have high aspect ratios (depth-to-width) due to miniaturization.

Conventional semiconductor devices typically comprise a semiconductor substrate, usually of doped monocrystalline silicon (Si), and a plurality of sequentially formed inter-metal dielectric layers and electrically conductive patterns. An integrated circuit is formed therefrom containing a plurality of patterns of conductive lines separated by inter-wiring spacings, and a plurality of interconnect lines, such as bus lines, bit lines, word lines and logic interconnect lines. Typically, the conductive patterns of vertically spaced metalization levels are electrically interconnected by vertically oriented conductive plugs filling via holes formed in the inter-metal dielectric layer separating the metalization levels, while other conductive plugs filling contact holes establish electrical contact with active device regions, such as a source/drain region of a transistor, formed in or on a semiconductor substrate. Conductive lines formed in trench-like openings typically extend substantially parallel to the semiconductor substrate. Semiconductor devices of such type according to current technology may comprise five or more levels of metalization to satisfy device geometry and microminiaturization requirements.

A commonly employed method for forming conductive plugs for electrically interconnecting vertically spaced metalization levels is known as "damascene"-type processing. Generally, this process involves forming a via opening in the inter-metal dielectric layer or interlayer dielectric (ILD) between vertically spaced metallization levels which is subsequently filled with metal to form a via electrically connecting the vertically spaced apart metal features. The via opening is typically formed using conventional lithographic and etching techniques. After the via opening is formed, the via is filled with a conductive material, such as tungsten (W), using conventional techniques, and the excess conductive material on the surface of the inter-metal dielectric layer is then typically removed by chemical mechanical planarization (CMP).

A variant of the above-described process, termed "dual damascene" processing, involves the formation of an opening having a lower contact or via opening section which communicates with an upper trench section. The opening is then filled with a conductive material to simultaneously form a contact or via in contact with a conductive line. Excess conductive material on the surface of the inter-metal dielectric layer is then removed by CMP. An advantage of the dual damascene process is that contact or via and the upper line are formed simultaneously.

High performance microprocessor applications require rapid speed of semiconductor circuitry, and the integrated circuit speed varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. If the interconnection node is routed over a considerable distance, e.g., hundreds of microns or more, as in submicron technologies, the interconnection capacitance limits the circuit node capacitance loading and, hence, the circuit speed. As integration density increases and feature size decreases, in accordance with submicron design rules, the rejection rate due to integrated circuit speed delays significantly reduces manufacturing throughput and increases manufacturing costs.

One way to increase the circuit speed is to reduce the resistance of a conductive pattern. Conventional metallization patterns are typically formed by depositing a layer of conductive material, notably aluminum (Al) or an alloy thereof, and etching, or by damascene techniques. Al is conventionally employed because it is relatively inexpensive, exhibits low resistivity and is relatively easy to etch. However, as the size of openings for vias/contacts and trenches is scaled down to the sub-micron range, step coverage problems result from the use of Al. Poor step coverage causes high current density and enhanced electromigration. Moreover, low dielectric constant polyamide materials, when employed as inter-metal dielectric layers, create moisture/bias reliability problems when in contact with Al, and these problems have decreased the reliability of interconnections formed between various metallization levels.

One approach to improved interconnection paths in vias involves the use of completely filled plugs of a metal, such as W. Accordingly, many current semiconductor devices utilizing VLSI (very large scale integration) technology employ Al for the metallization level and W plugs for interconnections between the different metallization levels. The use of W, however, is attendant with several disadvantages. For example, most W processes are complex and expensive. Furthermore, W has a high resistivity, which decreases circuit speed. Moreover, Joule heating may enhance electromigration of adjacent Al wiring. Still a further problem is that W plugs are susceptible to void formation, and the interface with the metallization level usually results in high contact resistance.

Another attempted solution for the Al plug interconnect problem involves depositing Al using chemical vapor deposition (CVD) or physical vapor deposition (PVD) at elevated temperatures. The use of CVD for depositing Al is expensive, and hot PVD Al deposition requires very high process temperatures incompatible with manufacturing integrated circuitry.

Copper (Cu) and Cu-based alloys are particularly attractive for use in VLSI and ULSI semiconductor devices, which require multi-level metallization levels. Cu and Cu-based alloy metallization systems have very low resistivities, which are significantly lower than W and even lower than those of previously preferred systems utilizing Al and its alloys. Additionally, Cu has a higher resistance to electromigration. Furthermore, Cu and its alloys enjoy a considerable cost advantage over a number of other conductive materials, notably silver (Ag) and gold (Au). Also, in contrast to Al and refractory-type metals (e.g., titanium (Ti), tantalum (Ta) and W), Cu and its alloys can be readily deposited at low temperatures formed by well-known "wet" plating techniques, such as electroless and electroplating techniques, at deposition rates fully compatible with the requirements of manufacturing throughput.

Electroless plating of Cu generally involves the controlled auto-catalytic deposition of a continuous film of Cu or an alloy thereof on a catalytic surface by the interaction of at least a Cu-containing salt and a chemical reducing agent contained in a suitable solution, whereas electroplating comprises employing electrons supplied to an electrode (comprising the surface(s) to be plated) from an external source (i.e., a power supply) for reducing Cu ions in solution and depositing reduced Cu metal atoms on the plating surface(s). In either case, a nucleation/seed layer is required for catalysis and/or deposition on the types of substrates contemplated herein. Finally, while electroplating requires a continuous nucleation/seed layer, very thin and discontinuous islands of a catalytic metal may be employed with electroless plating.

Another technique to increase the circuit speed is to reduce the capacitance of the inter-metal dielectric layers. Dielectric materials such as silicon oxide ($SiO_2$) have been commonly used to electrically separate and isolate or insulate conductive elements of the integrated circuit from one another. However, as the spacing between these conductive elements in the integrated circuit structure has become smaller, the capacitance between such conductive elements because of the dielectric being formed from silicon oxide is more of a concern. This capacitance negatively affects the overall performance of the integrated circuit because of increased power consumption, reduced speed of the circuitry, and cross-coupling between adjacent conductive elements.

In response to the problem of capacitance between adjacent conductive elements caused by use of silicon oxide dielectrics, other dielectric materials, commonly known as low-k dielectrics, have been used. Whereas silicon oxide has a dielectric constant of approximately 4.0, many low-k dielectrics have dielectric constants less than 3.5. Examples of low-k dielectric materials include organic or polymeric materials. Another example is porous, low density materials in which a significant fraction of the bulk volume contains air, which has a dielectric constant of approximately 1. The properties of these porous materials are proportional to their porosity. For example, at a porosity of about 80%, the dielectric constant of a porous silica film, i.e. porous $SiO_2$, is approximately 1.5. Still another example of a low-k dielectric material is carbon doped silicon oxide wherein at least a portion of the oxygen atoms bonded to the silicon atoms are replaced by one or more organic groups such as, for example, an alkyl group such as a methyl ($CH_3$——) group.

A number of different variations of a damascene process using low-k dielectrics have been employed during semiconductor manufacturing. With reference to FIGS. 1A–1G, an example of a damascene process for forming vias between vertically spaced metallization levels, according to conventional techniques, will be described. This process can be repeated to form multiple metallization levels, i.e., two or more, stacked one on top of another.

Figure 1A:
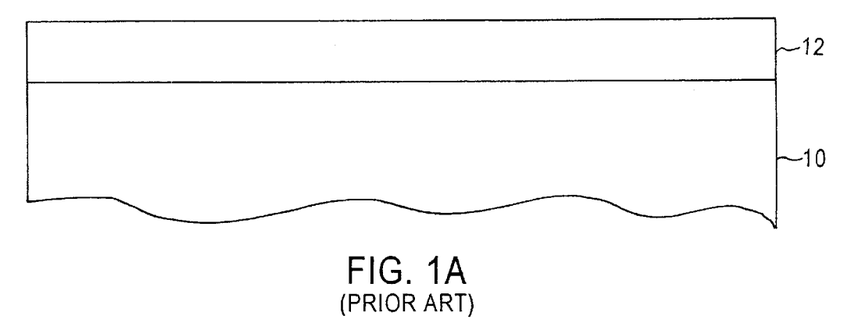
FIGS. 1A–1G schematically illustrate sequential phases of a conventional single damascene process.

In FIG. 1A, a first barrier layer 12 is deposited over a first metallization level 10. The first barrier layer 12 acts as a passivation layer that protects the first metallization level 10 from oxidation and contamination and prevents the material of the metallization level 10 from diffusing into a subsequently formed dielectric layer. The first barrier layer 12 also acts as an etch stop during subsequent etching of the dielectric layer. A typical material used as an etch stop is silicon nitride, and approximately 500 angstroms of silicon nitride is typically deposited over the metallization level 10 to form the first barrier layer 12. An illustrative process used for depositing silicon nitride is plasma enhanced CVD (PECVD).

Figure 1B:
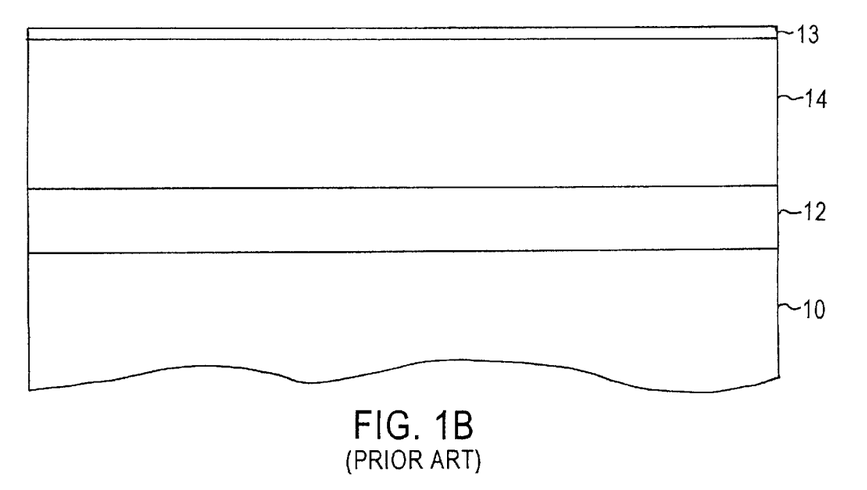

In FIG. 1B, a first low-k dielectric layer 14 is deposited over the first barrier layer 12. The majority of low-k dielectric materials used for a dielectric layer are based on organic or inorganic polymers. The liquid dielectric material is typically spun onto the surface under ambient conditions to a desired depth. This is typically followed by a heat treatment to evaporate solvents present within the liquid dielectric material and to cure the film to form the first low-k dielectric layer 14.

After formation of the first low-k dielectric layer 14, a capping layer 13 is typically formed over the first low-k dielectric layer 14. The function of the capping layer 13 is to protect the first low-k dielectric layer 14 from the process that removes a subsequently formed resist layer. The capping layer 13 is also used as a mechanical polishing stop to prevent damage to the first low-k dielectric layer 14 during subsequent polishing away of conductive material that is deposited over the first low-k dielectric layer 14 and in a subsequently formed via. Examples of materials used as a capping layer 13 include silicon oxide, silicon nitride, and silicon oxynitride.

Figure 1C:
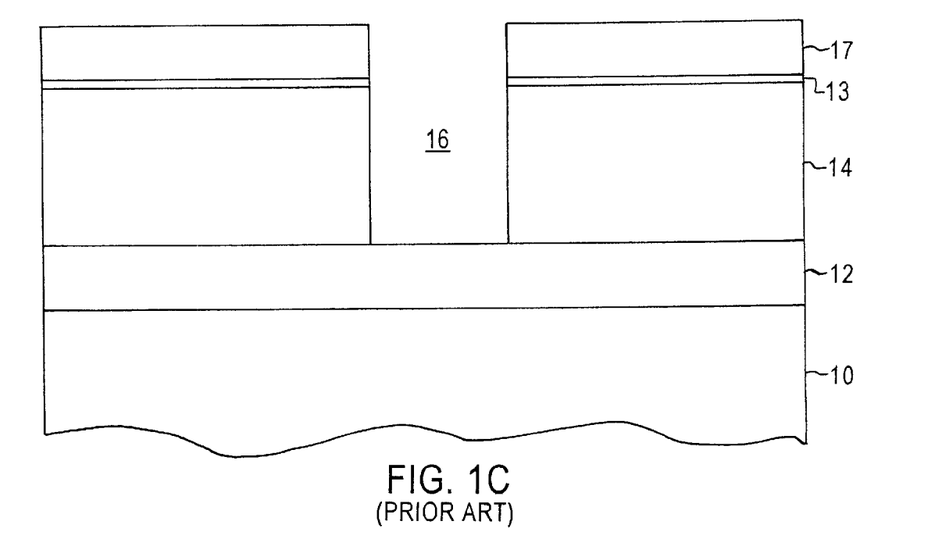

In FIG. 1C, vias 16 are formed in the first low-k dielectric layer 14 using conventional lithographic and etch techniques. The lithographic process involves depositing a resist 17 over the capping layer 13 and exposing and developing the resist 17 to form the desired patterns of the vias 16. The first etch, which is highly selective to the material of the first low-k dielectric layer 14 and the capping layer 13, removes the capping layer 13 and the first low-k dielectric layer 14 until the etchant reaches the first barrier layer 12. The first etch is typically an anisotropic etch, such as a reactive ion plasma dry etch, that removes only the exposed portions of the first low-k dielectric layer 14 directly below the opening in the resist 17. By using an anisotropic etch, the via 16 can be formed with substantially perpendicular sidewalls.

Figure 1D:
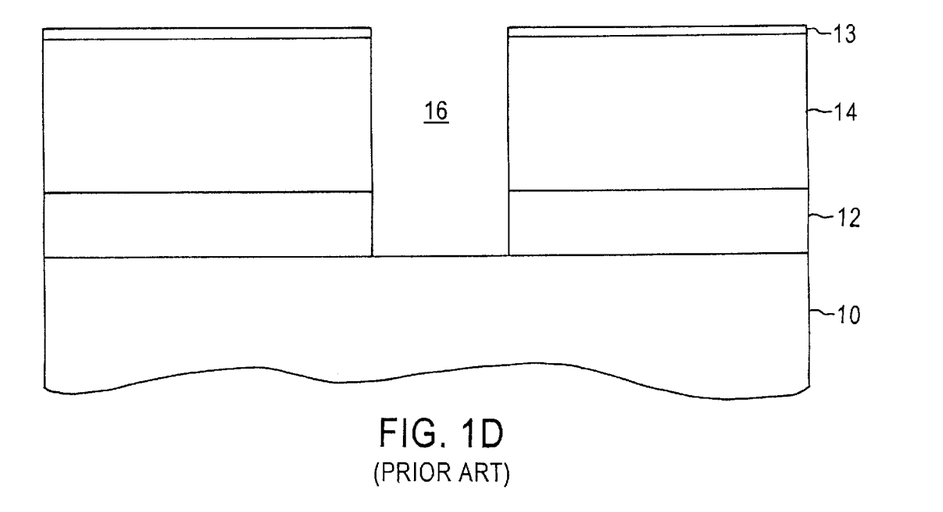

In FIG. 1D, the resist 17 is removed from over the first dielectric layer 14. A typical method of removing the resist 17 is known as "ashing" whereby the resist 17 is oxidized with an $O_2$ plasma at elevated temperatures. After the resist 17 is removed, a second etch, which is highly selective to the material of the first barrier layer 12, removes the first barrier layer 12 until the etchant reaches the first metallization level 10. An example of a species typically used for etching silicon nitride is $CH_3$, and an illustrative tool used for this process is a medium/high density plasma etcher.

Figure 1E:
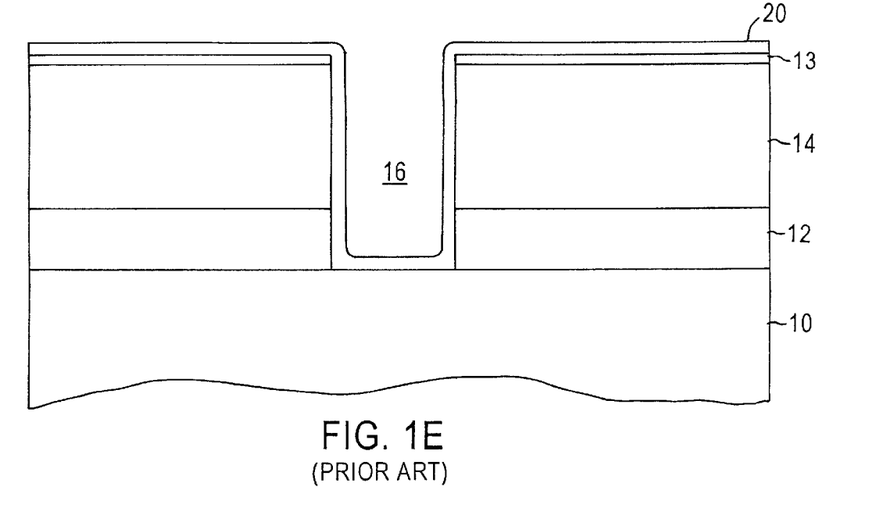

In FIG. 1E, an adhesion/barrier material, such as tantalum, titanium, tungsten, tantalum nitride, or titanium nitride, is deposited. The combination of the adhesion and barrier material is collectively referred to as a second barrier layer 20. The second barrier layer 20 acts to prevent diffusion into the first low-k dielectric layer 14 of the conductive material subsequently deposited into the via 16.

Figure 1F:
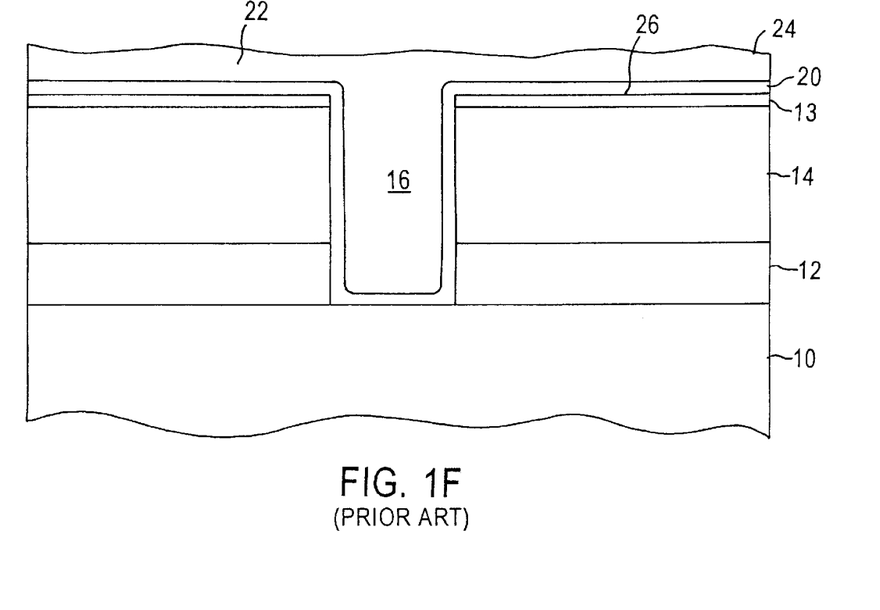

In FIG. 1F, a layer 22 of a conductive material, for example, a Cu or Cu-based alloy, is deposited into the via 16 and over the dielectric layer 14. A typical process initially involves depositing a "seed" layer on the second barrier layer 20 subsequently followed by conventional plating techniques, e.g., electroless or electroplating techniques, to fill the via 16. So as to ensure complete filling of the via 16, the Cu-containing conductive layer 22 is deposited as a blanket (or "overburden") layer 24 so as to overfill the via 16 and cover the upper surface 26 of the capping layer 13.

Figure 1G:
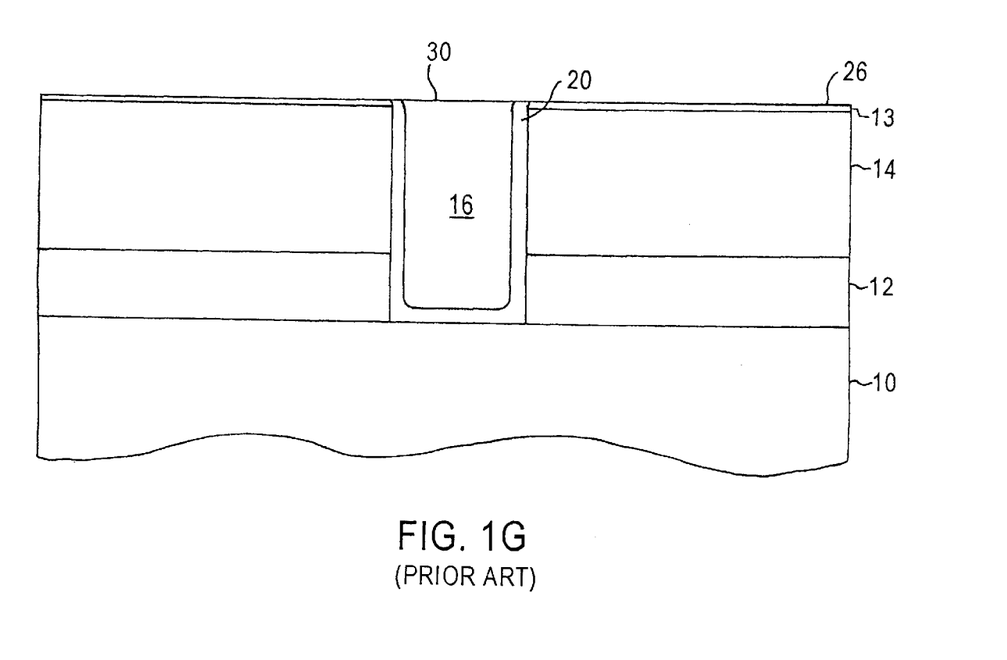

In FIG. 1G, the entire excess thickness of the metal overburden layer 24 over the upper surface 26 of the capping layer 13 is removed using a CMP process. A typical CMP process utilizes an alumina ($Al_2O_3$)-based slurry and leaves a conductive plug in the via 16. The conductive plug has an exposed upper surface 30, which is substantially co-planar with the surface 26 of the capping layer 13.

Although etching silicon nitride, such as found in the first barrier layer, with $CHF_3$ or separately with $CH_3F$ are standard processes, it has been recognized by the inventors that etching silicon nitride with $CH_2F_2$ provides lower resistivity (Ω/via) using copper than etching silicon nitride with either $CHF_3$ or $CH_3F$. Lower resistivity, as is well known in the art, allows for a desirable increase in circuit speed. A difficulty, however, that exists in implementing an etch process using $CH_2F_2$ is that commercial plasma etchers have a limited amount of preexisting plumbing that limits the number of different types of gas capable of being introduced into the etch chamber. As such, to add plumbing capable of providing $CH_2F_2$, preexisting etchers must undergo expensive refitting or new plasma etchers must be custom manufactured. The costs associated with these modifications are prohibitive and therefore can prevent the implementation of the plasma etching process using $CH_2F_2$. Accordingly, a need exists for a method of plasma etching that provides decreased resistivity of copper vias associated with the use of $CH_2F_2$ but does not require the costly modifications to preexisting and new equipment needed to provide plumbing for the use of $CH_2F_2$.

SUMMARY OF THE INVENTION

This and other needs are met by embodiments of the present invention which provide a method of manufacturing a semiconductor device. The method includes forming a first level, forming a first barrier layer over the first level, forming a dielectric layer over the first barrier layer, forming an opening having through the dielectric layer, etching the first barrier layer, and filling the opening with metal to form a first metal feature. The process also involves etching the first barrier level using both $CHF_3$ and $CH_3F$. Additionally, the first barrier layer can be formed from silicon nitride.

By using both $CHF_3$ and $CH_3F$ to etch the first barrier level, a decreased resistivity per via can be obtained in comparison to etching the first barrier level with just $CHF_3$ or with just $CH_3F$. This decrease in resistivity per via approximates the reduction in resistivity found when using $CH_2F_2$. Importantly, by using a combination of $CHF_3$ and $CH_3F$ instead of $CH_2F_2$, the reduction in resistivity can be obtained without modifying the plumbing of existing etchers or purchasing custom-made etchers to allow for the use of $CH_2F_2$. In so doing, substantial benefits are obtained in the reduction of the resistivity without the need for costly upgrades to equipment.

In an additional aspect of the invention, the ratio of $CHF_3:CH_3F$ can vary about 10:90 to about 90:10, and preferably the ratio varies from about 25:75 to about 75:25. In a current aspect of the invention, however, the amount of $CHF_3$ is about equal to the amount of $CH_3F$. Furthermore, the flow of both $CHF_3$ and $CH_3F$ can be from about 2.5 to about 150 sccm, and preferably the flow of both $CHF_3$ and $CH_3F$ can be from about 5 to about 30 sccm.

In a further aspect of the invention, the dielectric layer has a dielectric constant less than about 3.5. Also, the metal and the first level can comprise copper (Cu) or a Cu alloy. Furthermore, the opening can be a via opening, a trench, or a dual damascene opening comprising a lower via opening in communication with an upper trench; and the first metal feature can comprises a via, a line, or a combination of a lower via in contact with an upper line, respectively.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention addresses and solves the problem of finding a cost-effective method of increasing the circuit speed of a semiconductor device by providing a reduction in the resistivity per via. This is achieved, in part, by etching a silicon nitride barrier layer with a chemistry that includes both $CHF_3$ and $CH_3F$. As compared to etching a silicon nitride barrier layer with a standard chemistry of just $CHF_3$ or just $CH_3F$, etching with both $CHF_3$ and $CH_3F$ reduces the resistivity per via in copper and this reduction in resistivity allows for higher circuit speeds. This reduction in resistivity is comparable to the reduction in resistivity found when using $CH_2F_2$; however, the use of $CH_2F_2$ requires new plumbing to existing etchers or requires new etchers to be custom-fitted to allow for the use of $CH_2F_2$. The present invention advantageously combines two gasses, $CHF_3$ and $CH_3F$, currently being used separately to etch silicon nitride; and therefore, the benefit of lower resistivity can be obtained without costly modifications to existing equipment or the custom manufacture of new equipment.

Furthermore, the present invention addresses problems associated with the high capacitance of inter-metal dielectric layers. This is achieved, in part, by providing a dielectric layer formed from a low-k dielectric material. As used herein, the term low-k dielectric means a dielectric having a dielectric constant of less than about 3.5, e.g., less than about 2.5.

Figure 2A:
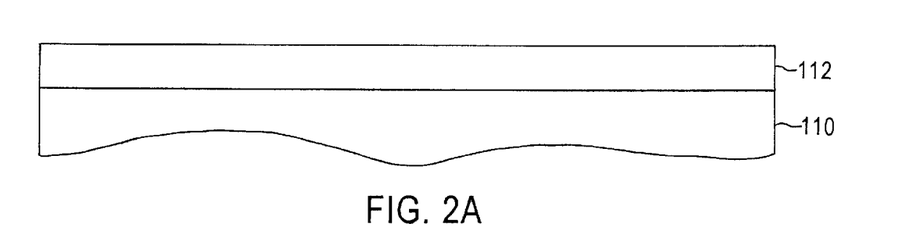
FIGS. 2A–2H schematically illustrate sequential phases of a single damascene process according to an embodiment of the present invention.

An embodiment of the present invention is illustrated in FIGS. 2A–2H. As illustrated in FIG. 2A, a first barrier layer 112 is deposited over a first level 110. The first level 110, however, is not limited as to a particular type of level. For example, the first level 110 can be a semiconductor surface, and a subsequently formed dielectric layer formed over the first level 110 can be termed an interlevel dielectric. The first level 110 can also be a metal layer substrate, such as a line or via, and the subsequently formed dielectric layer could therefore be termed an intermetal dielectric. The present disclosure is applicable to either type of first level 110. In one aspect of the invention, the first level 110 is a metal layer substrate; and as such, the first level 110 is therefore hereinafter referred to as a first metallization level 110.

The first barrier layer 112 can be formed from any material that prevents diffusion of the material from the metallization level 110 into a subsequently formed dielectric layer. For example, in a current aspect of the invention, the first metallization level 110 is formed from a Cu or Cu-based alloy. As such, the preferred first barrier layer 112 for use with Cu or Cu-based alloys acts as a diffusion barrier to Cu. The first barrier layer 112 can also act as a passivation layer that protects the first metallization level 110 from oxidation and contamination.

The thickness of the first barrier layer 112 depends upon factors such as the depth of a subsequently formed via in the dielectric layer over the first barrier layer 112. As such, the thickness of the first barrier layer 112 is preferably sufficient to act as an etch stop and not allow the etchant of the first barrier layer to reach the first metallization level 110. In current embodiments of the invention, the thickness of the first barrier layer 112 is at least 50 angstroms and is preferably from about 150 to about 600 angstroms.

In an aspect of the invention, the first barrier layer 112 is formed from silicon nitride although the invention is not limited in this manner. Silicon nitride advantageously acts as a diffusion barrier to copper and also as a passivation layer. Furthermore, silicon nitride acts as an etch stop to an etchant that etches low-k dielectric material. Any process capable of depositing the first barrier layer 112 is acceptable for use with the invention, and an illustrative process for depositing silicon nitride is PECVD.

Figure 2B:
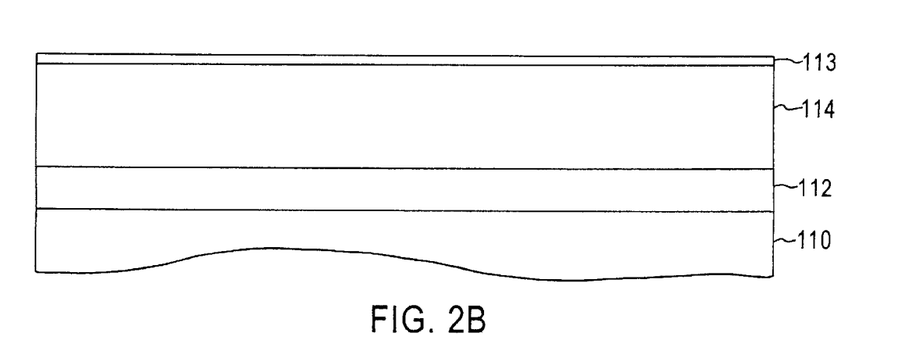

In FIG. 2B, a first dielectric layer 114 is deposited over the first barrier layer 112. The first dielectric layer 114 can be formed from any material capable of acting as a dielectric, and an illustrative material includes silicon oxide. In one aspect of the invention, the first dielectric layer 114 is formed from a low-k dielectric material. Illustrative examples of low-k dielectric materials include fluorosilicate glass (FSG or SiOF), hydrogenated diamond-like carbon (DLC), polystyrene, fluorinated polyimides, parylene (AF-4), polyarylene ether, and polytetrafluoro ethylene. In another aspect of the invention, the first dielectric layer 114 is formed from a dense or porous low-k dielectric material, such as siloxanes, silsesquioxanes, aerogels, and xerogels. These low-k dielectric materials can be applied via conventional spin-coating, dip coating, spraying, meniscus coating methods, in addition to other coating methods that are well-known in the art.

After formation of the first dielectric layer 114, a capping layer 113 can be formed over the first dielectric layer 114. The function of the capping layer 113 is to protect the first dielectric layer 114 from the process that removes a subsequently formed resist layer, and any material so capable is acceptable for use with the invention. The capping layer 113 can also be used as a mechanical polishing stop to prevent damage to the first dielectric layer 114 during subsequent polishing away of conductive material that is deposited over the first dielectric layer 114 and in a subsequently formed via. Examples of materials used as a capping layer 113 include silicon oxide and silicon nitride. In an aspect of the invention, the capping layer 113 is formed from silicon oxynitride and has a thickness of at least 50 angstroms. In another aspect of the invention, the thickness of the capping layer 113 is from about 400 to about 600 angstroms.

Figure 2C:
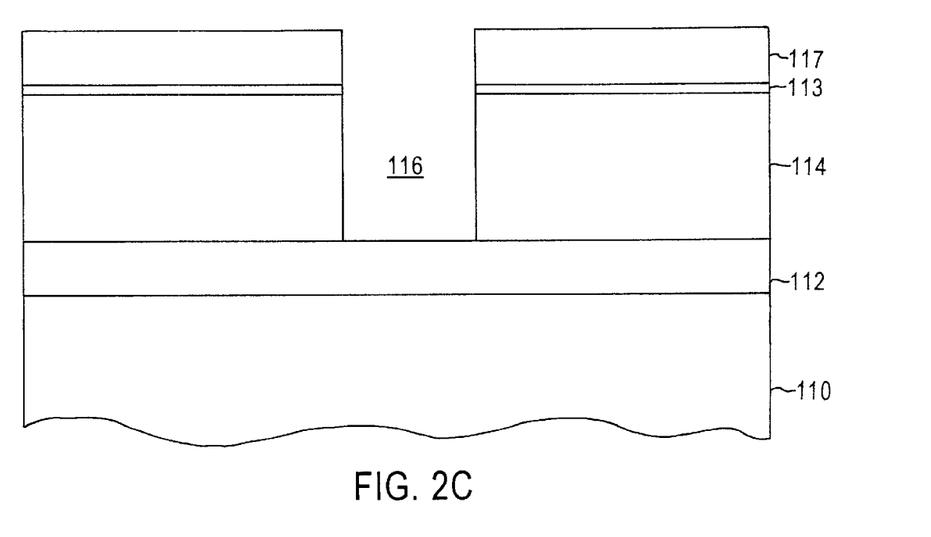

In FIG. 2C, vias 116 are formed in the first dielectric layer 114 and the capping layer 113 using conventional lithographic techniques, for example, optical lithography (including, for example, I-line and deep-UV), X-ray, and E-beam lithography, followed by etching. The lithographic process involves depositing a resist 117 over the capping layer 113 and exposing and developing the resist 117 to form the desired pattern of the vias 116.

The first etch, which is highly selective to the material of the first dielectric layer 114 and the capping layer 113, removes the capping layer 113 and the first dielectric layer 114 until the etchant reaches the first barrier layer 112. The first etch is typically an anisotropic etch, such as a reactive ion plasma dry etch, that removes only the exposed portions of the capping layer 113 and the first dielectric layer 114 directly below the opening in the resist 117. By using an anisotropic etch, the via 116 can be formed with substantially perpendicular sidewalls.

Figure 2D:
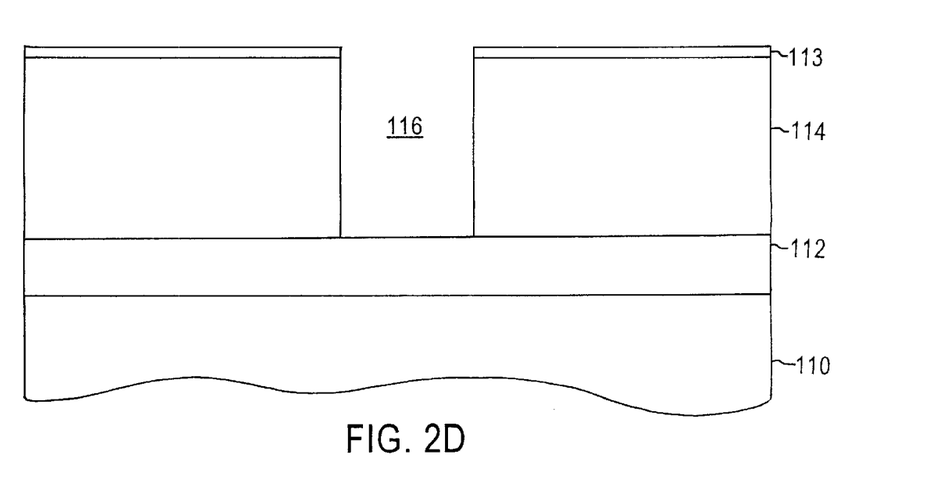

In a current aspect of the invention, as shown in FIG. 2D, the resist 117 is removed after the first etch. It should be noted, however, that the invention is not limited in this manner and the resist 117 can be removed, as is known in the art, after subsequent processing, for example, after the first barrier layer 112 is etched. Although any process capable of removing the resist 117 is acceptable for use with this invention, in a current aspect of the invention, the resist 117 is removed by oxidation using an $O_2$ plasma at elevated temperatures, otherwise known as "ashing."

The following chart provides illustrative ranges and preferred ranges for removal of the resist

| Parameter | Range | Preferred Range |
| --- | --- | --- |
| Pressure (Torr) | 0.02–1.0 | 0.1–2.0 |
| RF power (Watts) | 50–3000 | 300–1500 |
| $O_2$ flow (sccm) | 20–2000 | 100–1100 |
| Temperature (° C.) | −40–350 | 25–100 |
| Time (seconds) | 20–300 | 45–180 |

Figure 2E:
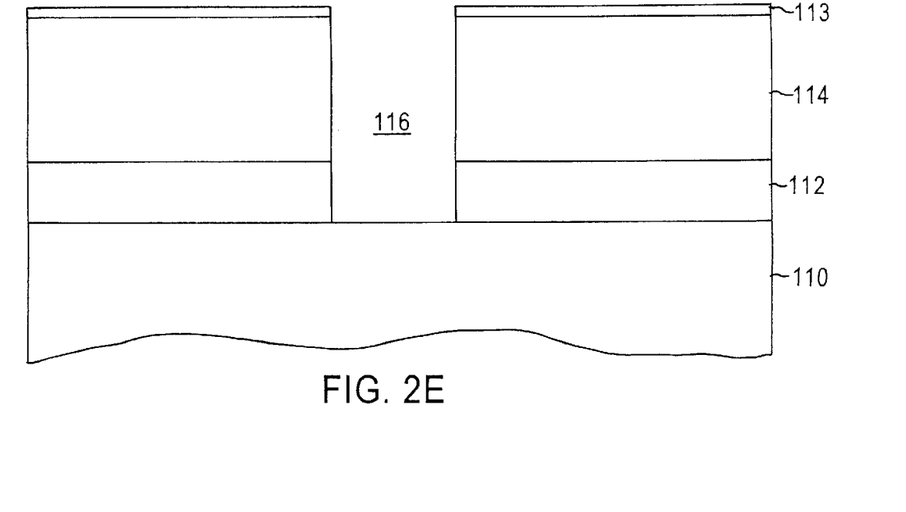

In FIG. 2E, after the resist 117 is removed, a second etch, which is highly selective to the material of the first barrier layer 112, then removes the first barrier layer 112 until the etchant reaches the first metallization layer 110. The second etch is also typically an anisotropic etch.

The following chart provides illustrative ranges and preferred ranges for removal of the resist

| Parameter | Range | Preferred Range |
| --- | --- | --- |
| Pressure (mTorr) | 5–500 | 25–150 |
| RF power (Watts) | 50–2500 | 200–1500 |
| $CHF_3$ flow (sccm) | 2.0–150 | 5–30 |
| $CH_3F$ flow (sccm) | 2.0–150 | 5–30 |
| $CHF_3$:$CH_3F$ ratio | 10:90 to 90:10 | 25:75 to 75:25 |
| $N_2$ flow (sccm) | 2–1000 | 5–300 |
| Temperature (° C.) | −40–120 | 15–50 |
| Time (seconds) | 5–180 | 10–80 |

The exact mechanism involved with etching silicon nitride using the combination of $CHF_3$ and $CH_3F$ is not known with certainty. However, the combination of $CHF_3$ and $CH_3F$ is capable of producing resistivities (Ω/via) in copper comparable to etching silicon nitride using $CH_2F_2$ as the reactive gas. Importantly, the decrease in resistivity can be obtained by using $CHF_3$ and $CH_3F$, which can be delivered to the reaction chamber without the need for additional plumbing to preexisting or commercially available etchers.

Figure 2F:
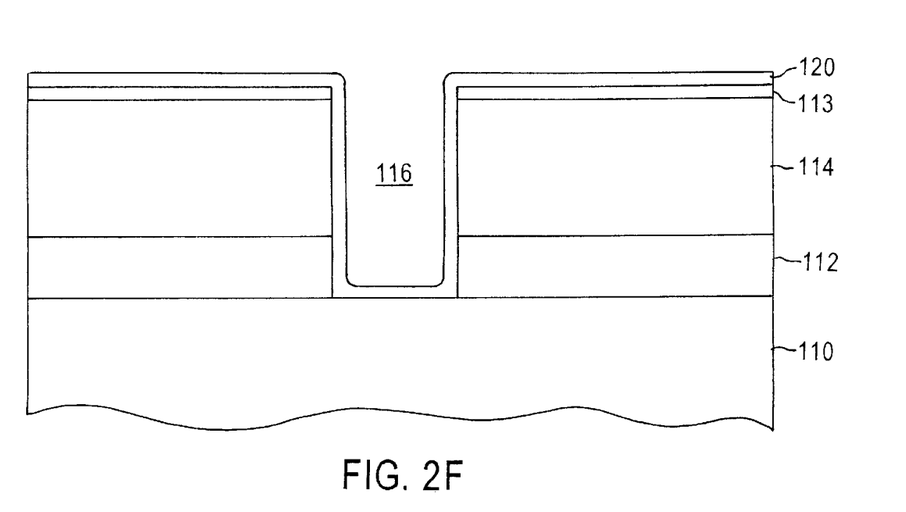

In FIG. 2F, an adhesion and barrier material, such as tantalum, titanium, tungsten, tantalum nitride, or titanium nitride, is deposited in the via 116. The combination of the adhesion and barrier material is collectively referred to as a second barrier layer 120. The second barrier layer 120 acts to prevent diffusion into the first dielectric layer 114 of the conductive material subsequently deposited into the via 116.

Figure 2G:
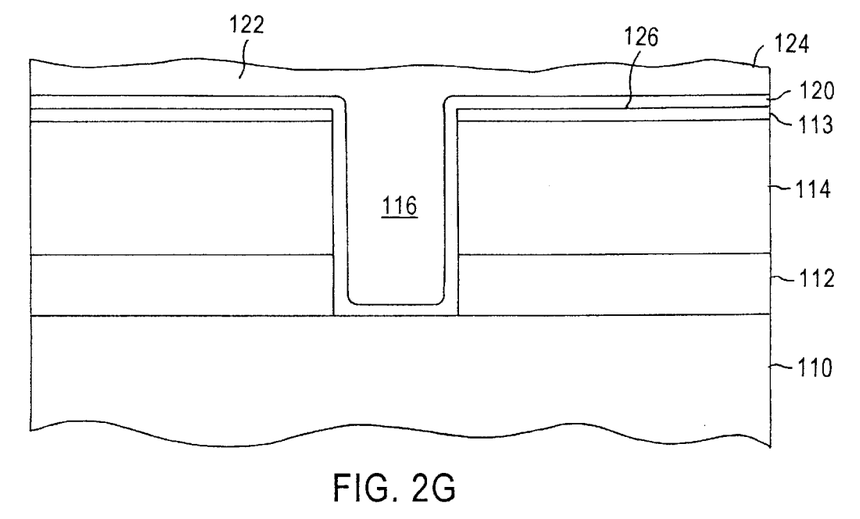

In FIG. 2G, a layer 122 of a conductive material is deposited into the via 116. In an aspect of the invention, the conductive material is a Cu or Cu-based alloy, and any process capable of depositing Cu into the via 116 is acceptable for use with this invention. An illustrative example of a process acceptable for use with this invention involves depositing a "seed" layer on the second barrier layer 120. After the seed layer has been formed, conventional plating techniques, e.g., electroless or electroplating techniques, are used to fill the via 116. So as to ensure complete filling of the via 116, the Cu-containing conductive layer 122 is deposited as a blanket (or "overburden") layer 124 so as to overfill the via 116 and cover the upper surface 126 of the capping layer 113.

Figure 2H:
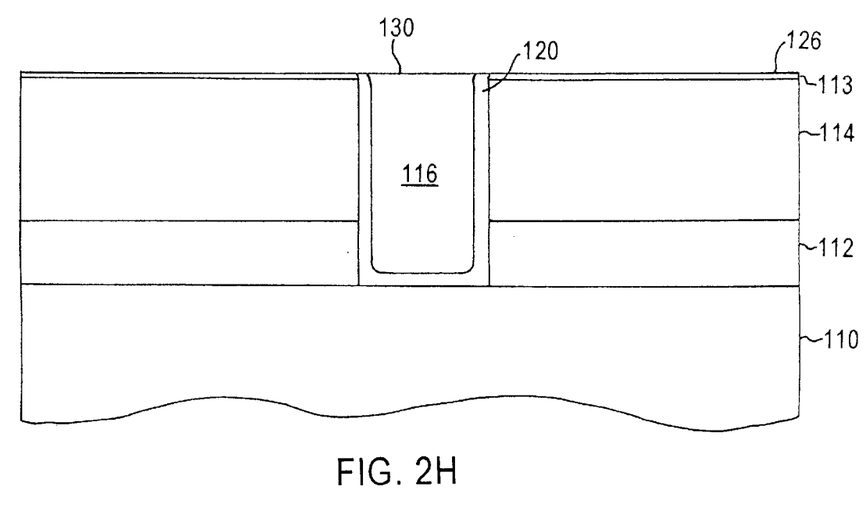

In FIG. 2H, the entire excess thickness of the metal overburden layer 124 over the upper surface 126 of the capping layer 113 is removed using a CMP process. A typical CMP process utilizes an alumina ($Al_2O_3$)-based slurry and leaves a conductive plug in the via 116. The conductive plug has an exposed upper surface 130, which is preferably substantially co-planar with the surface 126 of the capping layer 113.

By etching the silicon nitride first barrier layer with $CHF_3$ and $CH_3F$, a decrease in the resistivity per via can be advantageously realized. This decrease in resistivity can be realized using $CH_2F_2$ as a reactive gas; however, by using $CHF_3$ and $CH_3F$ as reactive gases, the benefit can be obtained without the need for expensive modifications to existing etchers or the need for custom-building new equipment to provide the additional plumbing for the $CH_2F_2$.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, comprising the steps of:
   forming a first level;
   forming a first layer on the first level; and
   etching the first layer to expose the first level using $CHF_3$ and $CH_3F$,
   wherein the first layer includes silicon nitride.

2. The method of manufacturing a semiconductor device according to claim 1, wherein the ratio of $CHF_3:CH_3F$ varies from about 10:90 to about 90:10.

3. The method of manufacturing a semiconductor device according to claim 2, wherein the first level comprises copper (Cu) or a Cu alloy.

4. A method of manufacturing a semiconductor device, comprising the steps of:
   forming a first level;
   forming a first barrier layer over the first level;
   forming a dielectric layer over the first barrier layer;
   forming an opening through the dielectric layer;
   etching the first barrier layer to expose the first level using $CHF_3$ and $CH_3F$; and
   filling the opening with metal to form a first feature, wherein the ratio of $CHF_3:CH_3F$ varies from about 10:90 to about 90:10.

5. The method of manufacturing a semiconductor device according to claim 4, wherein the ratio of $CHF_3:CH_3F$ varies from about 25:75 to about 75:25.

6. The method of manufacturing a semiconductor device according to claim 4, wherein the flow of $CHF_3$ is from about 2.0 to about 150 sccm.

7. The method of manufacturing a semiconductor device according to claim 6, wherein the flow of $CHF_3$ is from about 5 to about 30 sccm.

8. The method of manufacturing a semiconductor device according to claim 4, wherein the flow of $CH_3F$ is from about 2.0 to about 150 sccm.

9. The method of manufacturing a semiconductor device according to claim 8, wherein the flow of $CH_3F$ is from about 5 to about 30 sccm.

10. The method of manufacturing a semiconductor device according to claim 4, wherein the dielectric layer has a dielectric constant less than about 3.5.

11. The method of manufacturing a semiconductor device according to claim 4, wherein the flow of $CHF_3$ supplied during etching is about equal to the flow of $CH_3F$ supplied during the etching of the first layer.

12. The method of manufacturing a semiconductor device according to claim 4, wherein the opening is a via opening or a trench; and wherein the first feature comprises a via, a line, or a combination of a lower via in contact with an upper line, respectively.

13. A method of manufacturing a semiconductor device, comprising the steps of:
   forming a first metalization level formed from copper;
   forming a first barrier layer formed from silicon nitride over the first metallization level;
   forming a low-k dielectric layer over the first barrier layer;
   forming an opening through the dielectric layer;
   etching the first barrier layer to expose the first metallization level using about 5 to about 30 sccm of $CHF_3$ and about 5 to about 30 sccm of $CH_3F$; and
   filling the opening with copper or a copper alloy to form a first feature, wherein the ratio of $CHF_3:CH_3F$ varies from about 25:75 to about 75:25.

* * * * *